United States Patent
Ikeuchi et al.

(10) Patent No.: US 11,171,648 B2
(45) Date of Patent: Nov. 9, 2021

(54) DRIVE CIRCUIT AND DRIVE METHOD OF NORMALLY-ON TRANSISTOR

(71) Applicants: Kabushiki Kaisha Toshiba, Tokyo (JP); Toshiba Electronic Devices & Storage Corporation, Tokyo (JP)

(72) Inventors: Katsuyuki Ikeuchi, Yokohama Kanagawa (JP); Hideaki Majima, Minato Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/016,449

(22) Filed: Sep. 10, 2020

(65) Prior Publication Data
US 2021/0258011 A1 Aug. 19, 2021

(30) Foreign Application Priority Data
Feb. 14, 2020 (JP) .............................. JP2020-023314

(51) Int. Cl.
| H03K 17/10 | (2006.01) |
| H03K 17/567 | (2006.01) |
| H03K 17/687 | (2006.01) |
| H03K 19/0185 | (2006.01) |
| H03K 17/689 | (2006.01) |
| H03K 17/30 | (2006.01) |
| H03K 19/17784 | (2020.01) |

(52) U.S. Cl.
CPC ... *H03K 19/018521* (2013.01); *H03K 17/302* (2013.01); *H03K 17/689* (2013.01); *H03K 19/17784* (2013.01)

(58) Field of Classification Search
None
See application file for complete search history.

(56) References Cited

U.S. PATENT DOCUMENTS

| 7,777,553 | B2* | 8/2010 | Friedrichs | H03K 17/6871 327/436 |
| 8,228,113 | B2* | 7/2012 | Domes | H01L 25/16 327/427 |
| 8,558,584 | B2* | 10/2013 | Draxelmayr | H03K 5/1515 327/108 |
| 8,649,198 | B2* | 2/2014 | Kuzumaki | H02M 7/5387 363/132 |
| 8,729,566 | B2* | 5/2014 | Domes | H03K 17/063 257/77 |
| 8,988,133 | B2 | 3/2015 | Briere | |

(Continued)

FOREIGN PATENT DOCUMENTS

| JP | 2013-038406 A | 2/2013 |
| JP | 2016-201693 A | 12/2016 |

(Continued)

*Primary Examiner* — Kenneth B Wells

(57) ABSTRACT

According to one aspect of embodiments, a drive circuit of a normally-ON transistor includes: a normally-OFF transistor that includes a main current path connected in serial to a main current path of the normally-ON transistor; and a buffer circuit that supplies, to a gate of the normally-ON transistor, a control signal for controlling turning ON and OFF of the normally-ON transistor, whose high-voltage side and low-voltage side are biased by a bias voltage supplied from a power source unit.

4 Claims, 5 Drawing Sheets

(56) References Cited

U.S. PATENT DOCUMENTS

| | | | |
|---|---|---|---|
| 9,048,119 B2* | 6/2015 | Kanazawa | H03K 17/107 |
| 9,350,342 B2* | 5/2016 | Zojer | H03K 19/017509 |
| 9,455,697 B2* | 9/2016 | Norling | H03K 17/102 |
| 9,479,159 B2* | 10/2016 | Zojer | H02M 7/219 |
| 9,559,683 B2* | 1/2017 | Zojer | H02M 7/219 |
| 9,762,230 B2* | 9/2017 | Seeman | H03K 17/102 |
| 9,793,260 B2* | 10/2017 | Zojer | H03K 17/567 |
| 10,715,131 B2* | 7/2020 | Bunin | H03K 17/567 |
| 2015/0137619 A1 | 5/2015 | Seeman et al. | |
| 2018/0006640 A1 | 1/2018 | Seeman et al. | |

FOREIGN PATENT DOCUMENTS

| | | |
|---|---|---|
| JP | 2017-118630 A | 6/2017 |
| JP | 6470284 B2 | 2/2019 |

* cited by examiner

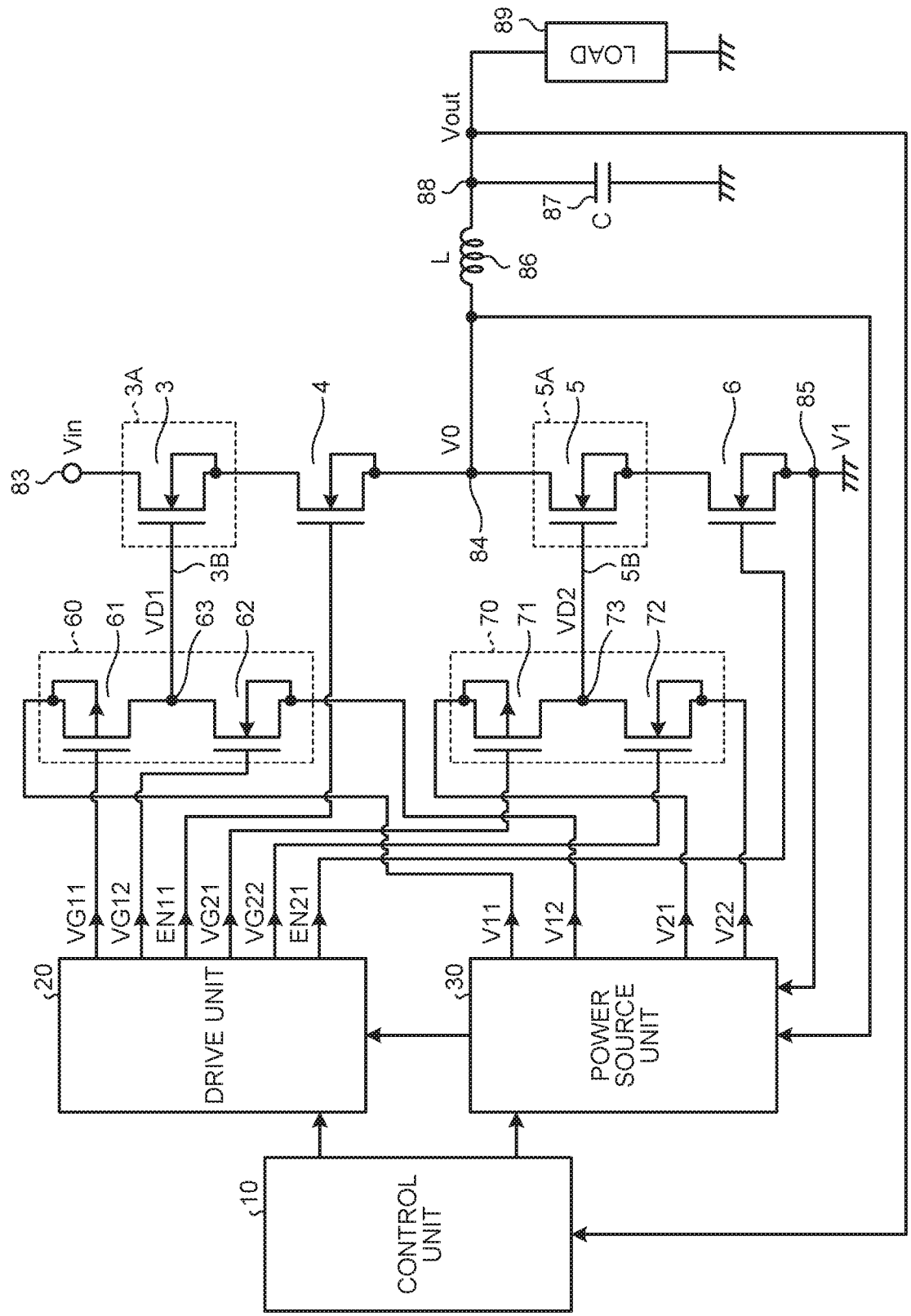

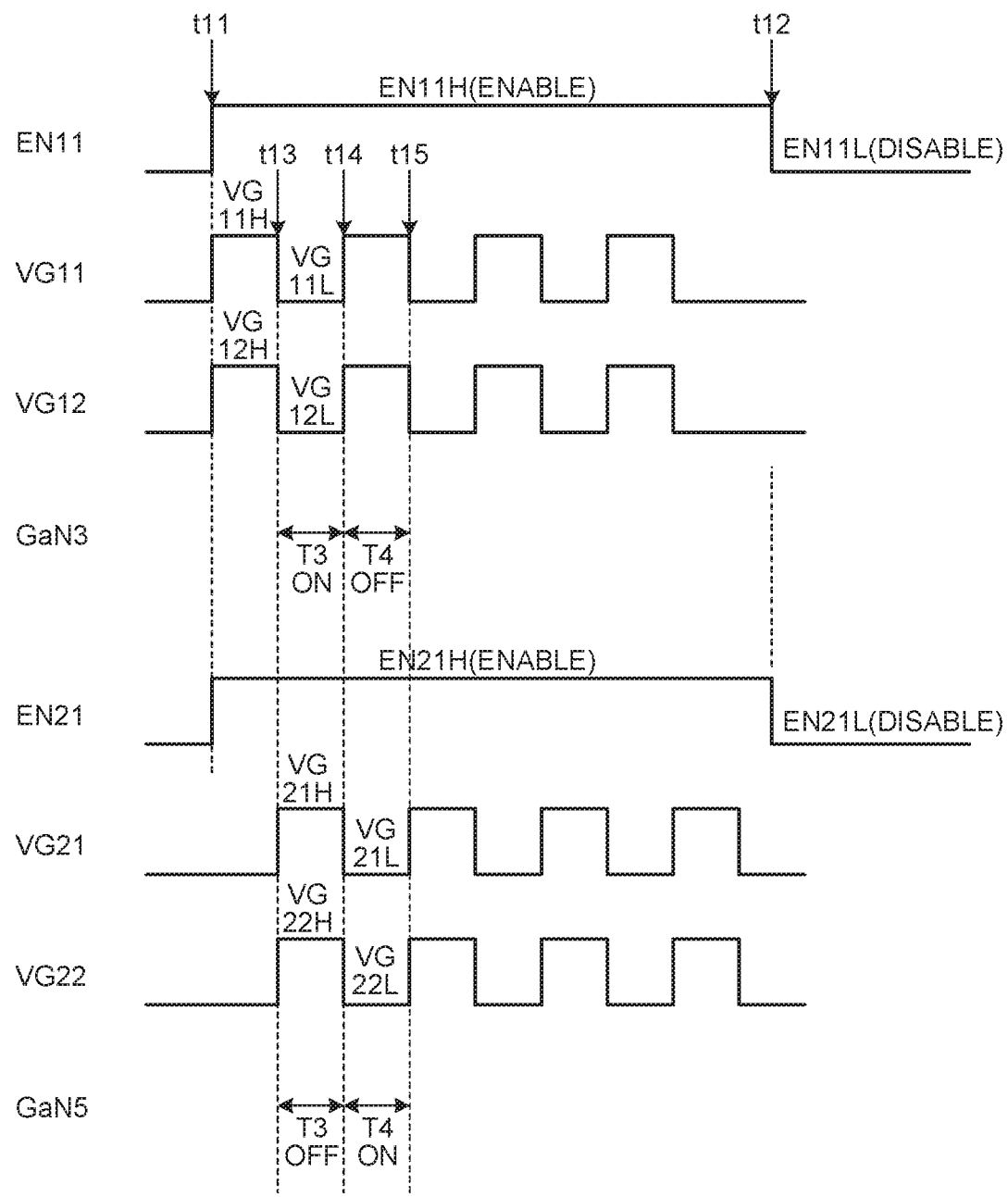

DRIVE CIRCUIT AND DRIVE METHOD OF NORMALLY-ON TRANSISTOR

CROSS-REFERENCE TO RELATED APPLICATIONS

This application is based upon and claims the benefit of priority from Japanese Patent Application No. 2020-023314, filed on Feb. 14, 2020; the entire contents of which are incorporated herein by reference.

FIELD

Embodiments described herein relate generally to a drive circuit and a drive method of a normally-ON transistor.

BACKGROUND

Conventionally, there has been disclosed a semiconductor device obtained by cascode-connecting a normally-ON transistor and a normally-OFF transistor, which is used as a switching element. For example, the normally-ON transistor is constituted of a transistor whose material is gallium nitride (GaN) or silicon carbide (SiC). When the normally-ON transistor whose material is GaN or SiC is used, it is possible to provide a semiconductor device having a high withstand voltage and a low loss.

When a gate voltage at turning ON of a normally-ON transistor is raised so as to reduce an ON resistance, driving capacity of the normally-ON transistor is able to be improved. However, there has been known that in a state where a GaN transistor, whose material is GaN, is used as a normally-ON transistor, for example, when a gate voltage with respect to a source voltage, in other words, a gate-source voltage $V_{GS}$ goes into a state of positive value ($=V_{GS}>0V$), a threshold value of the GaN transistor fluctuates, thereby leading to deterioration in its characteristics. Thus, there has been desired a drive circuit and a drive method capable of reliably turning ON and OFF a normally-ON transistor that is used as a switching element without deterioration in its characteristics.

BRIEF DESCRIPTION OF THE DRAWINGS

FIG. 5 is a diagram illustrating a drive circuit of a normally-ON transistor according to a second embodiment; and FIG. 6 is a diagram illustrating a drive method of the normally-ON transistor.

DETAILED DESCRIPTION

In general, according to one embodiment, a drive circuit of a normally-ON transistor includes: a normally-OFF transistor including (i) a drain that is connected to source of a normally-ON transistor including the source, a drain, and a gate and (ii) a main current path that is connected in serial to a main current path of the normally ON transistor; a buffer circuit that supplies in response to a drive signal, to the gate of the normally-ON transistor, a control signal that controls turning ON and OFF of the normally-ON transistor, wherein a high-electric potential side of the buffer circuit is biased by a first voltage and a low-electric-potential side of the buffer circuit is biased by a second voltage; and a power source unit that supplies, to the buffer circuit, the first voltage and the second voltage.

Exemplary embodiments of a drive circuit and a drive method of a normally-ON transistor will be explained below in detail with reference to the accompanying drawings. The present invention is not limited to the following embodiments.

Figure 1:
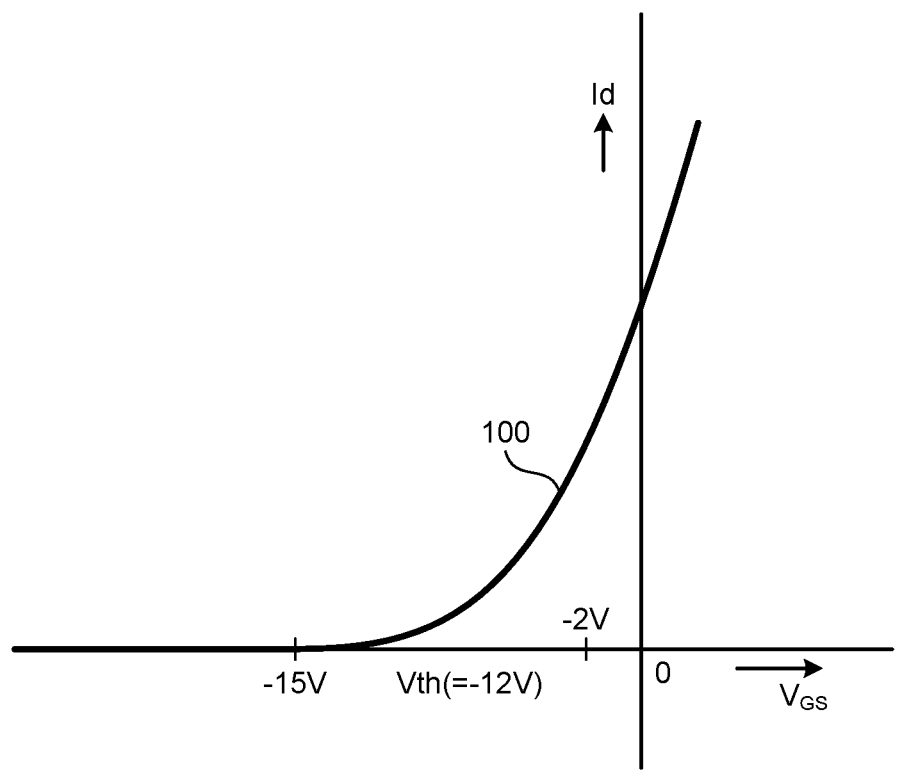
FIG. 1 is a diagram illustrating characteristics of a normally-ON transistor.

FIG. 1 is a diagram illustrating characteristics of a normally-ON transistor. There is illustrated a characteristic curve 100 in a case of an N-channel transistor. The lateral axis indicates the gate-source voltage $V_{GS}$, and the vertical axis indicates drain current Id. The drain current Id flows even when the gate-source voltage $V_{GS}$ is 0 V, and when the gate-source voltage $V_{GS}$ is a threshold voltage Vth, for example, a negative voltage that is lower than −12 V, the drain current Id is substantially 0 A. Note that a normally-ON transistor may be referred to as a depletion-mode transistor.

First Embodiment

Figure 2:
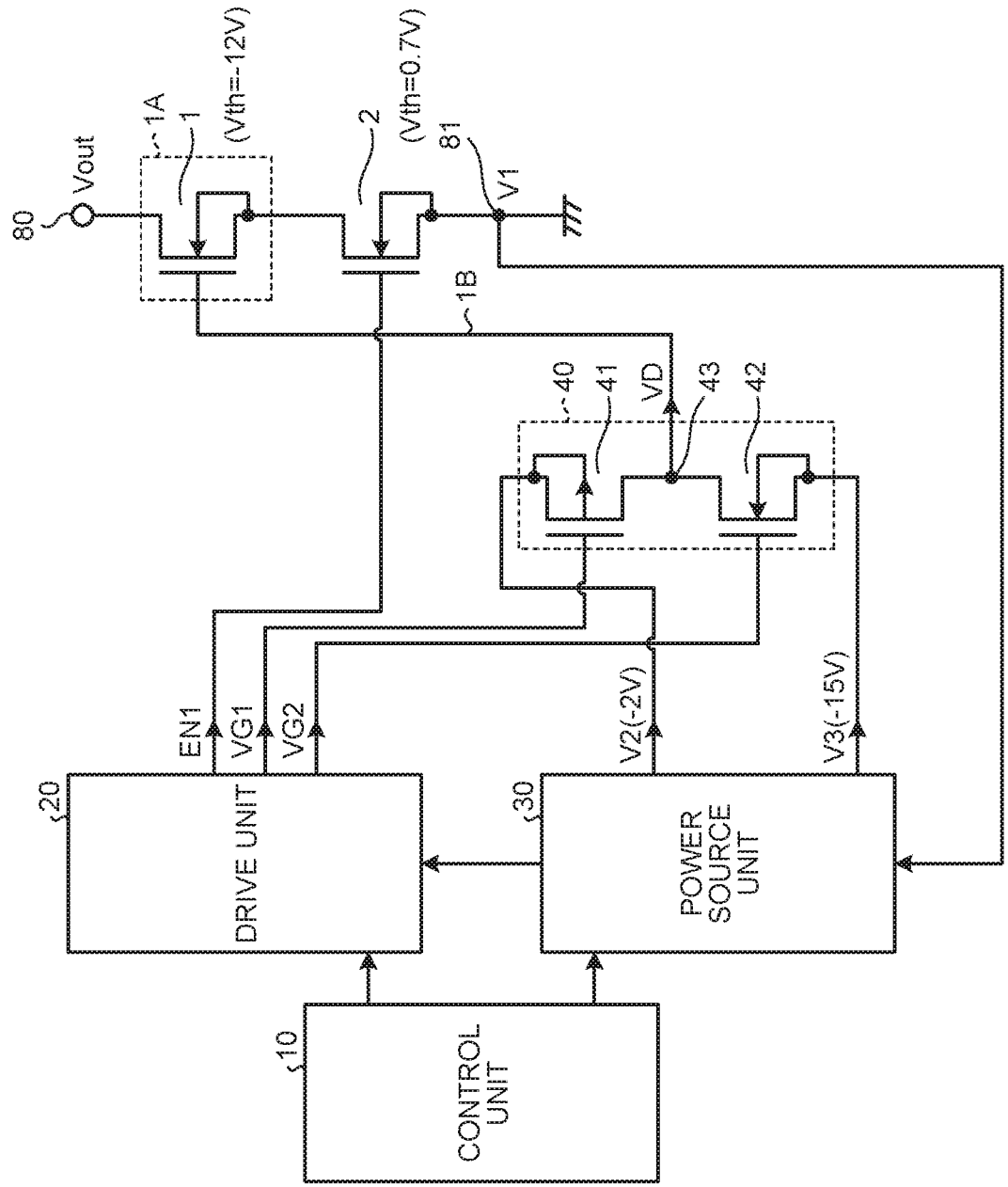
FIG. 2 is a diagram illustrating a drive circuit of a normally-ON transistor according to a first embodiment.

FIG. 2 is a diagram illustrating a drive circuit of a normally-ON transistor according to a first embodiment. The drive circuit according to the present embodiment includes a normally-ON transistor 1. The normally-ON transistor 1 has characteristics indicated by using the above-mentioned characteristic curve 100 illustrated in FIG. 1. The normally-ON transistor 1 is constituted of an N-channel Metal Oxide Semiconductor (MOS) transistor whose material is GaN, for example. In the MOS transistor whose material is GaN, a main current path between a drain and a source is constituted of GaN. Hereinafter, the MOS transistor whose material is GaN may be referred to as a GaN transistor.

When the normally-ON transistor 1 is constituted of a GaN transistor, for example, the normally-ON transistor 1 is constituted of an individual semiconductor chip 1A, and is integrally arranged on a common printed circuit board (not illustrated) with other configuration elements. A drain of the normally-ON transistor 1 is connected to an output terminal 80. The output terminal 80 outputs output voltage Vout of 400 V via a load (not illustrated), for example.

The drive circuit according to the present embodiment includes a normally-OFF transistor 2. The normally-OFF transistor 2 is constituted of an N-channel MOS transistor whose material is Si, for example. In the MOS transistor whose material is Si, a main current path between a drain and a source is constituted of Si. Hereinafter, the MOS transistor whose material is Si may be referred to as a Si transistor. The threshold voltage Vth of the normally-OFF transistor 2 is 0.7 V, for example. When the gate-source voltage $V_{GS}$ of the normally-OFF transistor 2 is higher than the threshold voltage Vth, the normally-OFF transistor 2 is turned ON. The normally-OFF transistor may be referred to as an enhancement-mode transistor.

A drain of the normally-OFF transistor 2 is connected to a source of the normally-ON transistor 1, and a source of the normally-OFF transistor 2 is connected to a terminal 81. The normally-ON transistor 1 and the normally-OFF transistor 2 form a cascade connection in which source-drain paths, which are main current paths, are connected in serial. The ground potential is supplied to the terminal 81, for example.

The drive circuit according to the present embodiment includes a control unit. 10, a drive unit. 20, a power source unit 30, and a buffer circuit 40. The control unit 10 controls the drive unit 20 and the power source unit 30. The control unit 10 controls a timing at which the drive unit 20 supplies an enable signal EN1 to the normally-OFF transistor 2 and timings at which the drive unit 20 supplies drive signals VG1 and VG2 to the buffer circuit 40. The control unit 10 controls values of bias voltages V2 and V3 that are output from the power source unit 30.

The power source unit 30 generates, in response to control of the control unit 10, the bias voltage 72 on a high-electric-potential side of the buffer circuit. 40 and the bias voltage V3 on a low-electric-potential side of the buffer circuit. 40 and supplies the generated voltages to the buffer circuit 40, The power source unit 30 generates the bias voltages 72 and 73 with reference to an electric potential of the terminal 81, in other words, the ground potential, for example. The power source unit 30 may be constituted of, for example, a charge pump, a boost converter, or the like.

The drive unit 20 generates the enable signal all and the drive signals VG1 and VG2, and supplies the generated signals to the normally-OFF transistor 2 and the buffer circuit 40. The drive unit 20 generates, with reference to the ground potential of the terminal 81 that is supplied from the power source unit 30, the enable signal EN1 and the drive signals VG1 and VG2.

The buffer circuit 40 includes a P-channel MOS transistor 41 arranged on an upper-stage side and an N-channel MOS transistor 42 arranged on an lower-stage side. Hereinafter, the P-channel MOS transistor may be referred to as a PMOS transistor, and the N-channel MOS transistor may be referred to as an NMOS transistor. The PMOS transistor 41 and the NMOS transistor 42 form a Complementary MOS (CMOS) circuit. The buffer circuit. 40 generates a control signal VD in response to the drive signals VG1 and VG2 that are supplied from the drive unit 20, and supplies, from a node 43 via a wire 1B, the generated signals to a gate of the normally-ON transistor 1.

The bias voltage 72 on a high-electric-potential side is set in such a manner that when the normally-ON transistor 1 is turned ON, the gate-source voltage $V_{GS}$ of the normally-ON transistor 1 is not a positive value, in other words, $V_{GS} > 0$ caused by the control signal VD that is supplied from the buffer circuit 40. For example, the bias voltage 72 on a high-electric-potential side is set to -2 V that is lower than a voltage V1 of a source of the normally-OFF transistor 2, in other words, the ground potential. This is for preventing, when the normally-ON transistor 1 is constituted of a GaN transistor, the gate-source voltage $V_{GS}$ from taking a positive voltage so as to prevent deterioration in characteristics due to fluctuation in the threshold voltage Vth.

For example, the bias voltage V3 on the low-electric-potential side is set to a voltage that is lower than the threshold voltage Vth of the normally-ON transistor 1, for example, -15 V. This is for preventing, when the normally-ON transistor 1 is turned OFF, application of a voltage that is higher than the threshold voltage Vth to a gate of the normally ON transistor 1 so as to reliably turn OFF the normally-ON transistor 1.

In the first embodiment, there is provided the power source unit 30 that supplies, to the buffer circuit 40 that supplies the control signal VD to a gate of the normally-ON transistor 1, the bias voltage V2 on the high-electric-potential side and the bias voltage V3 on the low-electric-potential side. The bias voltage V2 on the high-electric-potential side of the buffer circuit 40 and the bias voltage V3 on the low-electric-potential side of the buffer circuit 40 are variable and adjusted by the power source unit 30, so that it is possible to limit a voltage of the control signal VD that is supplied to a gate of the normally-ON transistor 1 when the normally-ON transistor 1 is turned ON and OFF. In other words, the operation is set in such a manner that the gate-source voltage $V_{GS}$ of the normally-ON transistor 1 is prevented from being a positive voltage when the normally-ON transistor 1 is turned ON and the gate-source voltage $V_{GS}$ of the normally-ON transistor 1 is lower than the threshold voltage Vth when the normally-ON transistor 1 is turned. OFF, so that it is possible to reliably turn OFF the normally-ON transistor 1.

Moreover, by employing the buffer circuit 40, driving capacity of the control signal VD is able to be improved and then applied to a gate of the normally-ON transistor 1, so that it is possible to execute a switching control of the normally-ON transistor 1 at high speed. By employing the power source unit 30 capable of adjusting and supplying the bias voltage V2 on the high-electric-potential side of the buffer circuit 40 and the bias voltage V3 on the low-electric-potential side of the buffer circuit 40, there is improved the degree of freedom in setting a voltage of the control signal VD that is suppled to the normally-ON transistor 1 from the buffer circuit 40, so that it is possible to improve the degree of freedom in designing the drive circuit.

Figure 3:
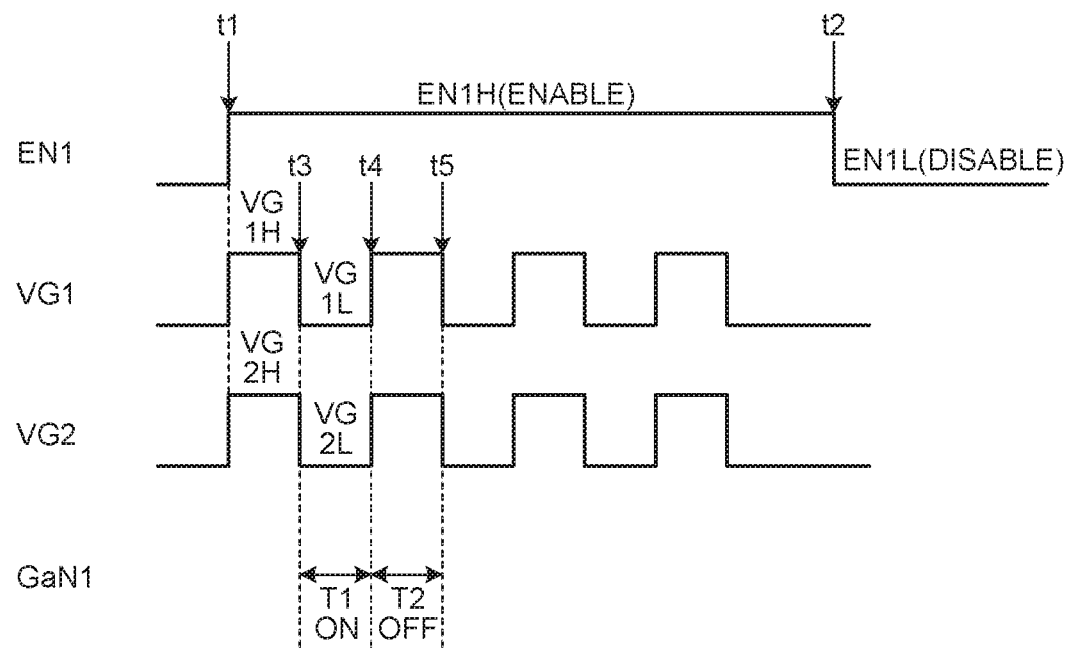
FIG. 3 is a diagram illustrating a drive method of the normally-ON transistor.

With reference to FIG. 3, a drive method of the normally-ON transistor according to the first embodiment will be explained. The uppermost row indicates the enable signal EN1 that is applied to a gate of the normally-OFF transistor 2. The enable signal EN1 becomes an H-level voltage EN1H at a timing t1, and turns ON the normally-OFF transistor 2. For example, when the threshold voltage Vth of the normally-OFF transistor 2 is +0.7 V, the voltage EN1H is +5 V. When the normally-OFF transistor 2 is turned ON, the operation goes into an enable state in which turning ON and OFF of the normally-ON transistor 1 is able to be controlled by the control signal VD supplied from the buffer circuit 40.

The next row indicates the drive signal VG1 that is applied to a gate of the PMOS transistor 41 of the buffer circuit 40. For example, when the threshold voltage Vth of the PMOS transistor 41 is -2.7 V, an H-level voltage VG1H of the drive signal VG1 is set to -2 V. An I-level voltage VG11, is set to -7 V, for example. When the L-level voltage VG11, of the drive signal VG1 is applied, the PMOS transistor 41 is turned ON, and the control signal VD having a voltage that is substantially the same as the bias voltage V2 on the high-electric-potential side is output from the node 43 of the buffer circuit 40.

The next row indicates the drive signal VG2 that is applied to a gate of the NMOS transistor 42 of the buffer circuit 40. For example, when the threshold voltage Vth of the NMOS transistor 42 is -14.3 V, an H-level voltage VG2H of the drive signal VG2 is set to -10 V. An L-level voltage VG21, is set to -15 V, for example. When the H-level voltage VG2H of the drive signal VG2 applied, the NMOS transistor 42 is turned ON, the control signal VD having a voltage that is substantially the same as the bias voltage V3 on the low-electric-potential side is output from the node 43 of the buffer circuit 40. Note that in order to avoid a through current when the PMOS transistor 41 and the NMOS transistor 42, which are constituting the buffer circuit 40, are simultaneously turned. ON, the drive signals VG1 and VG2 are generated while interposing a dead-time interval therebetween; however, illustration of the dead-time interval is omitted in the drawings for convenience of explanation.

The bottom row indicates a state of turning ON or OFF of the normally ON transistor 1. There is illustrated a case where the normally-ON transistor 1 is an N-channel GaN transistor. The normally-ON transistor 1 is turned ON during a time interval T1 between timings t3 to t4 where the PMOS transistor 41 of the buffer circuit 40 is turned ON, and the normally-ON transistor 1 is turned OFF during a time interval T2 between the timings t4 to t5 where the NMOS transistor 42 of the buffer circuit 40 is turned ON. When the enable signal EN1 is changed into an I-level voltage EN1L at a timing t2, the normally-OFF transistor 2 is accordingly turned OFF, and the operation goes into a disable state in which turning ON and OFF of the normally-ON transistor 1 is not able to be controlled by the control signal VD supplied from the buffer circuit 40. The voltage EN1L is the ground potential, for example.

A voltage of the control signal VD that is applied to a gate of the normally-ON transistor 1 may be adjusted by using the bias voltage V2 on the high-electric-potential side of the buffer circuit 40 and the bias voltage V3 on the low-electric-potential side of the buffer circuit 40. When the power source unit 30 appropriately adjusts the bias voltage V2 on the high-electric-potential side of the buffer circuit 40 and the bias voltage V3 on the low-electric-potential side of the buffer circuit 40, the gate-source voltage $V_{GS}$ of the normally-ON transistor 1 is able to be appropriately controlled, so that it is possible to drive the normally-ON transistor 1 without deterioration in its characteristics.

Figure 4:
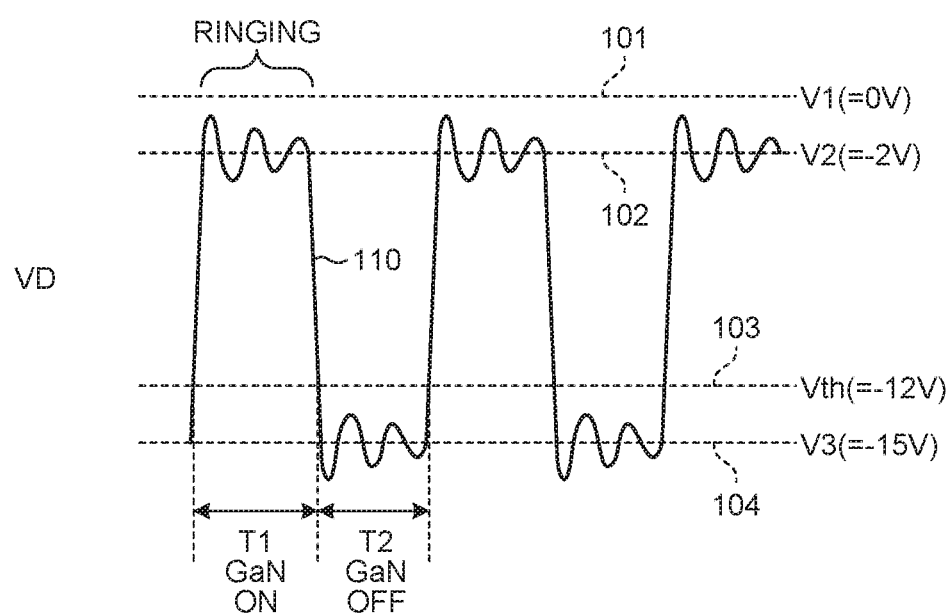
FIG. 4 is a diagram illustrating voltage setting in the drive method of the normally-ON transistor.

FIG. 4 is a diagram illustrating voltage setting and effects thereof in the drive method of the normally-ON transistor. The above-mentioned voltage setting according to the first embodiment may be employed, and such corresponds to the time intervals T1 and T2 illustrated in FIG. 3. A dashed line 101 indicates the voltage V1 of the terminal 81, in other words, the ground potential that is 0 V. A dashed line 102 indicates the bias voltage V2 on the high-electric-potential side of the buffer circuit 40. A dashed line 103 indicates the threshold voltage Vth of the normally-ON transistor 1. A dashed line 104 indicates the bias voltage V3 on the low-electric-potential side of the buffer circuit 40. A solid line 110 indicates the control signal VD. When an ON resistance of the normally-OFF transistor 2 is neglected, the voltage V1 corresponds to a source voltage of the normally-ON transistor 1.

When the PMOS transistor 41 of the buffer circuit 40 is turned ON in the time interval T1 during which the normally-ON transistor 1 is turned ON, there is output, from the node 43 of the buffer circuit 40, the control signal VD having a voltage corresponding to the bias voltage 72 on the high-electric-potential side. The control signal VD is supplied to a gate of the normally-ON transistor 1 via the wire 1B.

When the normally-ON transistor 1 is constituted of the individual semiconductor chip 1A, there presents a case where an inductance of the wire 1B that connects the node 43 of the buffer circuit 40 with the gate of the normally-ON transistor 1 is large in some cases. Thus, ringing is generated due to the inductance of the wire 1B, and thus the voltage of the control signal VD fluctuates. The bias voltage V2 on the high-electric-potential side of the buffer circuit 40 is set in consideration of the fluctuation in the control signal VD due to the ringing. For example, when the voltage fluctuation in the control signal VD due to the ringing is smaller than 2 V, the bias voltage V2 on the high-electric-potential side is set to −2 V, which is 2 V lower than the voltage V1, in other words, the ground potential that is 0 V. Thus, it is possible to prevent a case where the gate-source voltage $V_{GE}$ of the normally-ON transistor 1 becomes higher than. 0 V.

Similarly, when the NMOS transistor 42 of the buffer circuit. 40 is turned ON in the time interval T2 during which the normally-ON transistor 1 is turned OFF, there is output, from the node 43 of the buffer circuit 40, the control signal VD having a voltage corresponding to the bias voltage V3 on the low-electric-potential side. The bias voltage V3 is set to a voltage lower than the threshold voltage Vth so that the control signal VD does not exceed the threshold voltage Vth even when ringing occurs due to the inductance of the wire 1B. By employing such adjustment, it is possible to reliably turn OFF the normally-ON transistor 1.

The power source unit 30 is capable or adjusting the bias voltage 72 on the high-electric-potential side of the buffer circuit 40 and the bias voltage V3 on the low-electric-potential side of the buffer circuit 40, and thus a voltage of the control signal VD supplied to the gate of the normally-ON transistor 1 from the buffer circuit 40 is able to be appropriately adjusted, so that it is possible to turn ON the normally-ON transistor 1 and further to reliably turn OFF the normally-ON transistor 1 under a state where deterioration in the characteristics is prevented.

Second Embodiment

FIG. 5 is a diagram illustrating a drive circuit of a normally-ON transistor according to a second embodiment. Configurations corresponding to those in the above-mentioned embodiment are represented with the same reference symbols, and the description is omitted appropriately. In the present embodiment, there is provided a normally-ON transistor 3 whose drain is connected to a terminal 83 to which a Direct-Current input voltage Vin is applied. A source of the normally-ON transistor 3 is connected to a drain of a normally-OFF transistor 4. The source of the normally-OFF transistor 4 is connected to a node 84. The normally-ON transistor 3 and the normally-OFF transistor 4 form a cascode connection in which source-drain paths, which are main current paths, are connected in serial. The normally-ON transistor 3 is an N-channel GaN transistor, for example, and is constituted of an individual semiconductor chip 3A. The normally-OFF transistor 4 is constituted of an N-channel MOS transistor whose material is Si, for example.

In the present embodiment, there are provided a normally-ON transistor 5 and a normally-OFF transistor 6 that form a cascode connection in which source-drain paths, which are main current paths, are connected in serial between the node 84 and a grounding end 85. The normally-ON transistor 5 is an N-channel GaN transistor, for example, and is constituted of an individual semiconductor chip 5A, The normally-OFF transistor 6 is constituted of an NMOS transistor whose material is Si, for example.

One end of an inductor 86 is connected to the node 84, and the other end of the inductor 86 is connected to an output terminal 88. One end of a smoothing capacitor 87 is connected to the output terminal 88, and the other end of the smoothing capacitor 87 is grounded. The output voltage Vout of the output terminal 88 is supplied to a load 89.

In the present embodiment, there are provided the control unit 10, the drive unit 20, the power source unit 30, and buffer circuits 60 and 70. Feedback voltage of the output voltage Vout is supplied to the control unit 10. The control unit 10 includes a Pulse Width Modulation (PWM) control unit (not illustrated), for example. The control unit 10 compares the feedback voltage of the output voltage Vout with a predetermined reference voltage (not illustrated), and executes PWM control for controlling pulse widths of drive signals VG11, VG12, VG21, and VG22 that are supplied to the buffer circuits 60 and 70 from the drive unit 20 in accordance with the comparison result. In the present embodiment, there is configured a DC/DC converter that converts the Direct-Current input voltage Vin into the desired Direct-Current output voltage Vout.

The power source unit 30 supplies a bias voltage V11 to a high-electric-potential side of the buffer circuit 60, and further supplies a bias voltage V12 to a low-electric-potential side of the buffer circuit 60. The power source unit 30 supplies a bias voltage V21 to a high-electric-potential side of the buffer circuit 70, and further supplies a bias voltage V22 to a low-electric-potential side of the buffer circuit 70. The power source unit 30 outputs the bias voltages val, V12, V21, and V22 on the basis of the voltage V1 of the grounding end 85 and a voltage V0 of the node 84.

On the basis of the voltage supplied from the power source unit 30, the drive unit 20 outputs the drive signals VG11, VG12, VG21, and VG22 to be supplied to the buffer circuits 60 and 70 and enable signals EN11 and EN21 to be supplied to the normally-OFF transistors 4 and 6.

The buffer circuit 60 supplies, via a wire 3B, a control signal VD1 to a gate of the normally-ON transistor 3. The buffer circuit 70 supplies, via a wire 5B, a control signal VD2 to a gate of the normally-ON transistor 5.

A drive method of a normally ON transistor according to the second embodiment will be explained with reference to FIG. 6. The uppermost row indicates the enable signal EN11 that is supplied to a gate of the normally-OFF transistor 4 from the drive unit 20. At a timing t11, the drive unit 20 turns the enable signal EN11 into an H-level voltage EN11H so as to turn ON the normally-OFF transistor 4. On the basis of the voltage supplied from the power source unit 30, the drive unit 20 sets the voltage EN11H to be output therefrom to (V0+5 V), for example, and further sets an L-level voltage EN11L to be output therefrom to the voltage V0 of the node 84, for example.

The next row indicates the drive signal VG11 that is supplied to a gate of a PMOS transistor 61 of the buffer circuit 60. The drive unit 20 sets an H-level voltage VG11H and an L-level voltage VG11L on the basis of the bias voltage V11 supplied from the power source unit 30 and the voltage V0 of the node 84. For example, the voltage of the drive signal VG11 is set to that higher than that of the above-mentioned drive signal VG1 according to the first embodiment by the voltage VD. When the L-level voltage VG11L of the drive signal VG11 is applied, the PMOS transistor 61 is turned ON, and the control signal VD1 having a voltage substantially the same as the bias voltage V11 on the high-electric-potential side is output from an output end 63 of the buffer circuit 60.

The next row indicates the drive signal VG12 that is supplied to a gate of an NMOS transistor 62 of the buffer circuit 60. On the basis of the bias voltage V12 supplied from the power source unit 30 and the voltage V0 of the node 84, the drive unit 20 sets an H-level voltage VG12H and an L-level voltage VG12L. For example, the voltage of the drive signal VG12 is set to that higher than that of the above-mentioned drive signal 702 according to the first embodiment by the voltage V0. When the H-level voltage VG12H of the drive signal VG12 is applied, the NMOS transistor 62 is turned ON, the control signal VD1 having a voltage substantially the same as the bias voltage V12 on the low-electric-potential side is output from the output end 63 of the buffer circuit 60.

The next row indicates a state of turning ON or OFF of the normally-ON transistor 3. The normally-ON transistor 3 is turned ON during a time interval 13 between timings t13 to t14 where the PMOS transistor 61 on the upper-stage side of the buffer circuit 60 is turned ON, and the normally-ON transistor 3 is turned OFF during a time interval 14 between the timings t14 to t15 where the NMOS transistor 62 on the lower-stage side of the buffer circuit 60 is turned ON.

The next row indicates the enable signal EN21 that is applied to a gate of the normally-OFF transistor 6. The enable signal. EN21 is changed into an H-level voltage EN21H at the timing t11 so as to turn ON the normally-OFF transistor 6.

The next row indicates the drive signal VG21 that is supplied to a gate of a PMOS transistor 71 of the buffer circuit 70. When an L-level voltage VG21L of the drive signal VG21 is applied, the PMOS transistor 61 is turned ON, the control signal VD2 having a voltage substantially the same as the bias voltage V21 on the high-electric-potential side is output from an output end 73 of the buffer circuit 70.

The next row indicates the drive signal VG22 that is supplied to a gate of an NMOS transistor 72 of the buffer circuit 70, When an H-level voltage VG22H of the drive signal VG22 is applied, the NMOS transistor 72 is turned ON, the control signal VD2 having a voltage substantially the same as the bias voltage V22 on the low-electric-potential side is output from an output end 73 of the buffer circuit 70.

The H-level and I-level voltages of the enable signal EN21 and the drive signals VG21 and VG22 may be set similarly to the above-mentioned voltages of the enable signal EN1 and the drive signals VG1 and VG2 according to the first embodiment.

The bottom row indicates a state of turning ON or OFF of the normally-ON transistor 5. There is illustrated a case where the normally-ON transistor 5 is an N-channel GaN transistor. The normally-ON transistor 5 is turned OFF during the time interval 13 between timings t13 to t14 where the NMOS transistor 72 on the lower-stage side of the buffer circuit 70 is turned ON, and the normally-ON transistor 5 is turned ON during the time interval 14 between the timings t14 to t15 where the PMOS transistor 71 on the upper-stage side of the buffer circuit 70 is turned ON.

A voltage of the control signal VD1 applied to a gate of the normally-ON transistor 3 may be adjusted by the bias voltage V11 on the high-electric-potential side of the buffer circuit 60 and the bias voltage V12 on the low-electric-potent al side of the buffer circuit 60. Thus, the gate-source voltage $V_{GS}$ of the normally-ON transistor 3 is able to be controlled. Therefore, it is possible to prevent a case where a gate voltage of the normally-ON transistor 3 becomes higher than a source voltage of the normally-ON transistor 3 caused by the control signal VD1 supplied from the buffer circuit 60 at turning ON of the normally-ON transistor 3, so that it is further possible to prevent deterioration in characteristics due to fluctuation in a threshold value of the normally-ON transistor 3. Furthermore, even when there is adjusted a voltage of the control signal VD1 supplied from the buffer circuit 60 at turning OFF of the normally-ON transistor 3 and thus the gate-source voltage $V_{GS}$ of the normally-ON transistor 3 fluctuates due to ringing, it is possible to prevent a case where a gate voltage of the normally-ON transistor 3 is higher than the threshold voltage Vth, so that it is further possible to reliably turn OFF the normally-ON transistor 3.

Similarly, regarding the control for turning ON and OFF the normally-ON transistor 5, when the bias voltages V21 and V22 of the buffer circuit 70 are adjusted, it is possible to prevent fluctuation in the threshold voltage Vth of the normally-ON transistor 5, so that it is further possible to execute the control for reliably turning OFF the normally-ON transistor 5.

According to the present embodiment, there is provided the power source unit 30 that supplies the bias voltages V11, V12, V21, and V22 of the buffer circuits 60 and 70 that supplies the control signals Vigil and VD2 to the gates of the normally-ON transistors 3 and 5. By employing the power source unit 30, the bias voltages V11, V12, V21, and V22 are able to be arbitrary adjusted, so that it is possible to control the gate-source voltage Vs at turning ON and OFF the normally-ON transistors 3 and 5. Thus, it is possible to prevent a state where the gate-source voltage $V_{GS}$ is positive at turning ON of the normally-ON transistors 3 and 5, so that it is further possible to prevent deterioration in the characteristics due to fluctuation in the threshold voltage Vth. Moreover, it is possible to prevent a state where the gate-source voltage $V_{GS}$ at turning OFF of the normally-ON transistors 3 and 5 is higher than the threshold voltage Vth, so that it is further possible to reliably turn OFF the normally-ON transistors 3 and 5.

Note that bias voltages to be supplied to the buffer circuits 40, 60, and 70 may be set in consideration of ON resistances of the normally-OFF transistors 2, 4, and 6. When ON resistances of the normally-OFF transistors 2, 4, and 6 are high, source voltages of the normally-ON transistors 1, 3, and 5 increase and become high with respect to the reference voltages, in other words, the ground potential or the voltage V0 of the node 84. Thus, even in a case where the bias voltages V2 and V21 on the high-electric-potential sides of the buffer circuits 40 and 70 are higher than source voltages of the normally-OFF transistors 2 and 6, in other words, the ground potential, or the bias voltage V11 on the high-electric-potential side of the buffer circuit 60 is set to a voltage higher than the voltage V0 of the node 84, when voltages of the control signals VD, VD1, and VD2, which are applied at turning ON the normally-ON transistors 1, 3, and 5, are adjusted, it is possible to prevent a state where gate voltages are higher than source voltages of the normally-ON transistors 1, 3, and 5. When the bias voltages V2 and V21 on the high-electric-potential sides of the buffer circuits 40 and 70 are set to be high, voltages of the control signals VD, VD1, and VD2, which are supplied to gates at turning ON of the normally-ON transistors 1, 3, and 5, are able to be high, so that it is possible to improve driving capacity of the normally-ON transistors 1, 3, and 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A drive circuit of a normally-ON transistor, the drive circuit comprising:
    a first normally-OFF transistor including:
        a drain that is connected to a source of a first normally-ON transistor including a drain connected to an input-voltage supplying end, the source, and a gate;
        a source that is connected to an output node; and
        a gate;
    a first buffer circuit that outputs a first control signal to be supplied to a gate of the first normally-ON transistor, wherein a high-electric-potential side of the first buffer circuit is biased by a first voltage and a low-electric-potential side of the first buffer circuit is biased by a second voltage;
    a second normally-OFF transistor including:
        a drain that is connected to a source of a second normally-ON transistor including a drain connected to the output node, the source, and a gate;
        a source that is connected to a grounding terminal; and
        a gate;
    a second buffer circuit that outputs a second control signal to be applied to a gate of the second normally-ON transistor, wherein a high-electric-potential side of the second buffer circuit is biased by a third voltage and a low-electric-potential side of the second buffer circuit is biased by a fourth voltage; and
    a power source unit configured to:
        supply the first voltage and the second voltage to the first buffer circuit; and
        supply the third voltage and the fourth voltage to the second buffer circuit, wherein the power source unit sets the first to the fourth voltages based on a voltage of the grounding terminal and a voltage of the output node.

2. The drive circuit of the normally-ON transistor according to claim 1, wherein the first buffer circuit and the second buffer circuit comprise respective CMOS circuits.

3. The drive circuit of the normally-ON transistor according to claim 1, wherein the first normally-ON transistor and the second normally-ON transistor are included on respective individual semiconductor chips.

4. The drive circuit of the normally-ON transistor according to claim 1, further comprising:
    an output terminal that is connected to the output node and outputs an output voltage; and
    a control unit that controls, based on a feedback voltage of the output voltage, pulse widths of the first control signal and the second control signal.

\* \* \* \* \*